US005572346A

United States Patent [19]
Sakamoto et al.

[11] Patent Number: 5,572,346
[45] Date of Patent: Nov. 5, 1996

[54] TAPE CARRIER FOR LCD DRIVER PACKAGE WITH ANCHOR HOLES ON EITHER SIDE OF AND SPACED 0.2 MM TO 10 MM FROM THE CHIP MOUNTING SITE

[75] Inventors: Kazunori Sakamoto, Yokohama; Kazuhiro Umemoto, Kusatsu, both of Japan

[73] Assignee: International Business Machines Corporation, Armonk, N.Y.

[21] Appl. No.: 345,109

[22] Filed: Nov. 28, 1994

[30] Foreign Application Priority Data

Nov. 26, 1993 [JP] Japan ................................. 5-296442

[51] Int. Cl.⁶ .......................... G02F 1/1345; H05K 1/00; H01L 23/495
[52] U.S. Cl. ......................... 359/88; 174/254; 257/669; 361/749
[58] Field of Search ............................. 359/88; 174/254; 361/749; 257/669

[56] References Cited

U.S. PATENT DOCUMENTS 5,404,239  4/1995  Hirai ........................ 359/88

OTHER PUBLICATIONS

"Stress Relief for Tape Automated Bonding (TAB) Tape", Research Disclosure, Oct. 1988, No. 294.

*Primary Examiner*—Anita Pellman Gross
*Assistant Examiner*—Walter J. Malinowski
*Attorney, Agent, or Firm*—Ronald L. Drumheller

[57] ABSTRACT

In an LCD driver package using a TAB tape carrier an object of this invention is to prevent damage to the input leads from being caused under the influence of the twisting or wrinkling of TAB tape due to the difference in thermal expansion coefficient between the printed circuit board and the LCD glass board, and so forth. At least one pair of anchor hole 40 are formed in the TAB tape carrier 10 of an LCD driver package having input leads 12 connected to a printed circuit board 24, output leads 14 connected to an LCD glass board 26, and a chip 22, the tape carrier 10 being fixed on the printed circuit board 24 with solder or an adhesive using anchor holes 40 after mounting of the LCD driver chip. Fixing through such anchor holes prevents the twisting or wrinkling of the tape from propagating to the input leads.

5 Claims, 3 Drawing Sheets

TAPE CARRIER FOR LCD DRIVER PACKAGE WITH ANCHOR HOLES ON EITHER SIDE OF AND SPACED 0.2 MM TO 10 MM FROM THE CHIP MOUNTING SITE

BACKGROUND OF THE INVENTION

1. Field of the Invention

This invention related to a tape carrier for a liquid crystal display (LCD) driver package and an LCD using such a tape carrier.

2. Related Art

A liquid crystal display (LCD) uses 9 TAB tape carrier as a means of connecting its printed circuit board to the electrodes on the glass board of its liquid crystal panel. An LCD driver chip is mounted on the TAB tape carrier. FIG. 1 shows a conventional TAB tape carrier 10 for an LCD driver package. FIG. 2 shows the state in which such a tape carrier is connected to a printed circuit board and the glass board of a liquid crystal panel. The TAB tape carrier 10 has an insulating film tape 11 formed of a polyimide layer, input lead conductors 12 laid on its surface, and output lead conductors 14. The TAB tape carrier 10 has a chip mounting opening 16, which provides a chip mounting site. The input leads 12 extend from the chip mounting opening 16 toward one edge of the tape and are terminated across a long slot 18 formed along this edge. The output leads 14 extend from the chip mounting opening 16 toward the other edge of the tape. On the side of the output leads 14, no opening is formed. An LCD driver chip 22 is connected to the input leads 12 and output leads 14 in the position of the chip mounting opening 16. In this manner, an LCD driver tape carrier package is formed.

When an LCD driver package is mounted on an LCD unit, the tape edge on the side of the input leads 12 is cut along line A—A (FIG. 1), so that the tips of the input leads 12 are exposed. The exposed tips of the input leads 12 are soldered to the corresponding conductors (not illustrated) of the printed circuit board 24 and the output leads 14 are connected to the corresponding panel electrodes of the LCD glass board 26. Since the output leads 14 are usually formed at a higher density than the input leads 12, they are liable to cause problems such as short-circuiting when connected, if the output leads 14 are not backed with the film tape. For this reason, the output leads 14 are connected to the glass board in a state of being supported on the insulating film tape 11. Since the glass board is flat, the output leads 14 can be connected even as they are attached to the insulating film tape 11. On the other hand, the conductors on the printed circuit board 24 are not necessarily of equal height and hence the input leads 12 are exposed so that they can adapt to such differences in height.

In the conventional structure, the tape 10 suffers repetitive stress in the directions indicated by arrows 28 and 30 on account of the difference in thermal expansion coefficient between the printed circuit board 24 and the LCD glass board 26 as well as vibration, or deflection or deformation of the printed circuit board 24. The stress in the tape 10 causes twists or wrinkles chiefly in regions 32 and 34, and thus inflicts damage particularly on the input leads 12 near regions 36 and 38 with a high probability of lead breaking. The output leads 14 are relatively high in mechanical strength because of being supported by the insulating film tape 11 and hence hardly suffer any damage. It is advantageous to shorten the length, L (FIG. 2), of the TAB tape carrier 10 for making the LCD driver assembly compact, and to widen the width, W, according to enlarging of the display. However, as the length, L, of the TAB tape carrier 10 becomes smaller and the width, W, becomes greater, the tape carrier 10 becomes more susceptible to damage by stress.

As conventional measures for solving this problem, there are known some methods: (1) reinforcing the input leads by resin coating, (2) providing dummy leads on both sides of the input lead array, or (3) thickening the lead conductors. However, the method of resin coating involves some problems. That is, silicone resin is used in the method for curing temperature requirements, but silicone resin does not ensure sufficient strength. It entails a troublesome resin coating step, and, in addition, makes it impossible to replace the driver package after resin coating. The method of providing dummy leads can prevent leads adjacent to such dummy leads from being damaged, but cannot prevent leads remote from the dummy leads from being damaged. The method of thickening leads is not economical and also makes fine patterning difficult.

SUMMARY OF THE INVENTION

Accordingly, an object of this invention is to provide a tape carrier for a liquid crystal display driver package capable of simply solving the above-mentioned problem of lead damage or lead breaking, and a liquid crystal display using such a tape carrier. A tape carrier for an LCD driver package of this invention has at least one pair of anchor holes for anchoring the tape carrier to a printed circuit board in a region where neither input leads nor output leads are formed. The anchor holes are provided on both sides of the chip. Such a tape carrier with anchor holes can be fixed with solder or an adhesive after an LCD driver package has been mounted.

The twisting or wrinkling of the tape can be prevented from propagating to the input leads by fixing the tape carrier to the printed circuit board through the anchor holes.

DESCRIPTION OF THE PREFERRED EMBODIMENTS

Figure 1:
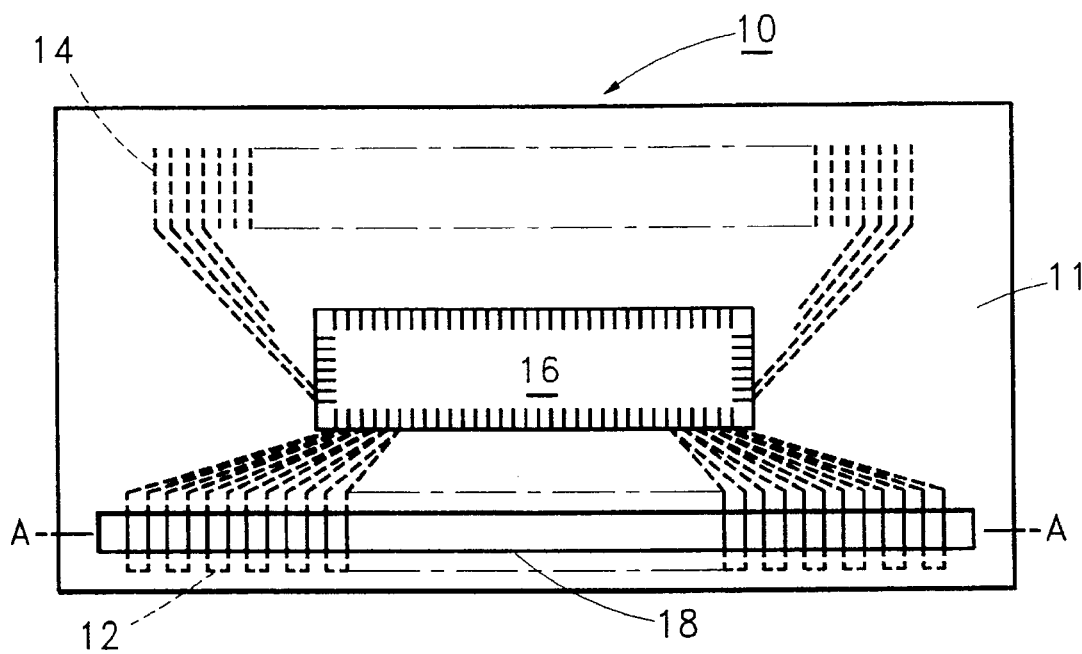
FIG. 1 shows a conventional TAB tape carrier for an LCD driver package.
Figure 2:
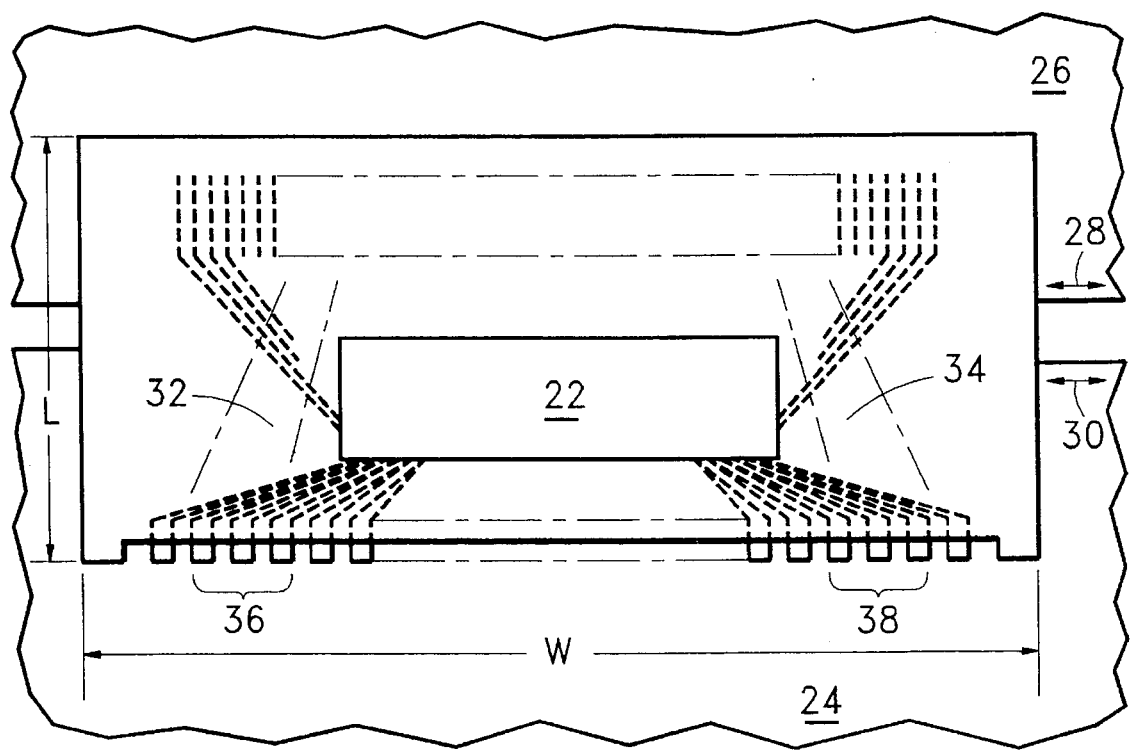
FIG. 2 shows the state in which the conventional LCD driver package is mounted.
Figure 3:
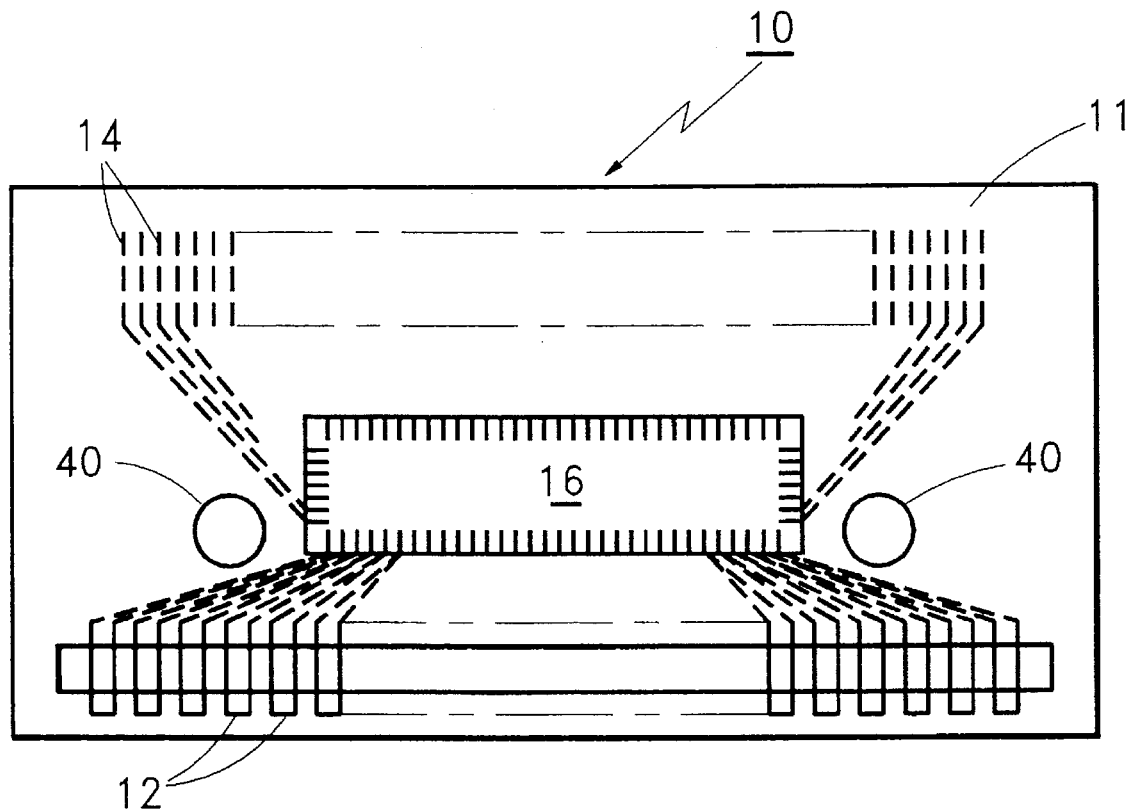
FIG. 3 shows a TAB tape carrier for an LCD driver package of this invention.

FIG. 3 shows a tape carrier for an LCD driver package of this invention. In FIGS. 3 through 6, the components corresponding to those shown in FIGS. 1 and 2 are assigned the same reference numbers. This invention features the provision of anchor holes 40 on both sides of a chip mounting opening 16 in a tape region where no leads are formed. For example, such anchor holes are formed 0.2 to 10 mm apart from the opening 16, the layout of which may, however, vary depending on the design of the LCD driver package.

Figure 4:
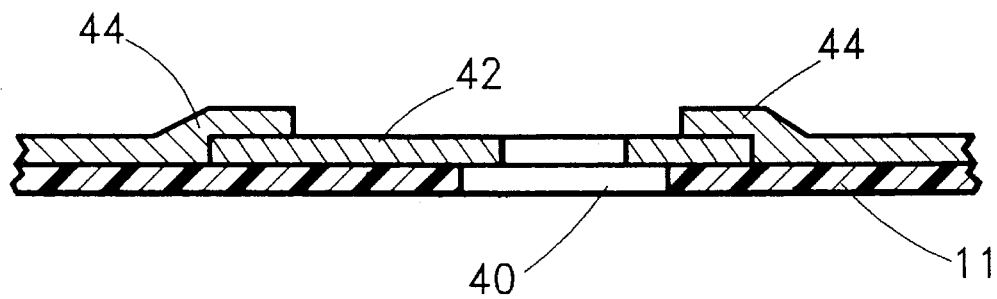
FIG. 4 is a cross sectional view of the anchor hole portion of a tape carrier of this invention.

FIG. 4 shows a cross-sectional structure of an anchor hole 40. The anchor hole 40 is bored through a polyimide film tape 11 and an anchor pad 42 formed upon the tape 11. The anchor pad 42 is formed in the position of the corresponding anchor hole 40 so that the tape carrier 10 can be soldered to the printed circuit board. The periphery of the anchor pad 42 and other tape surfaces are covered with a solder resist layer 44.

Figure 5:
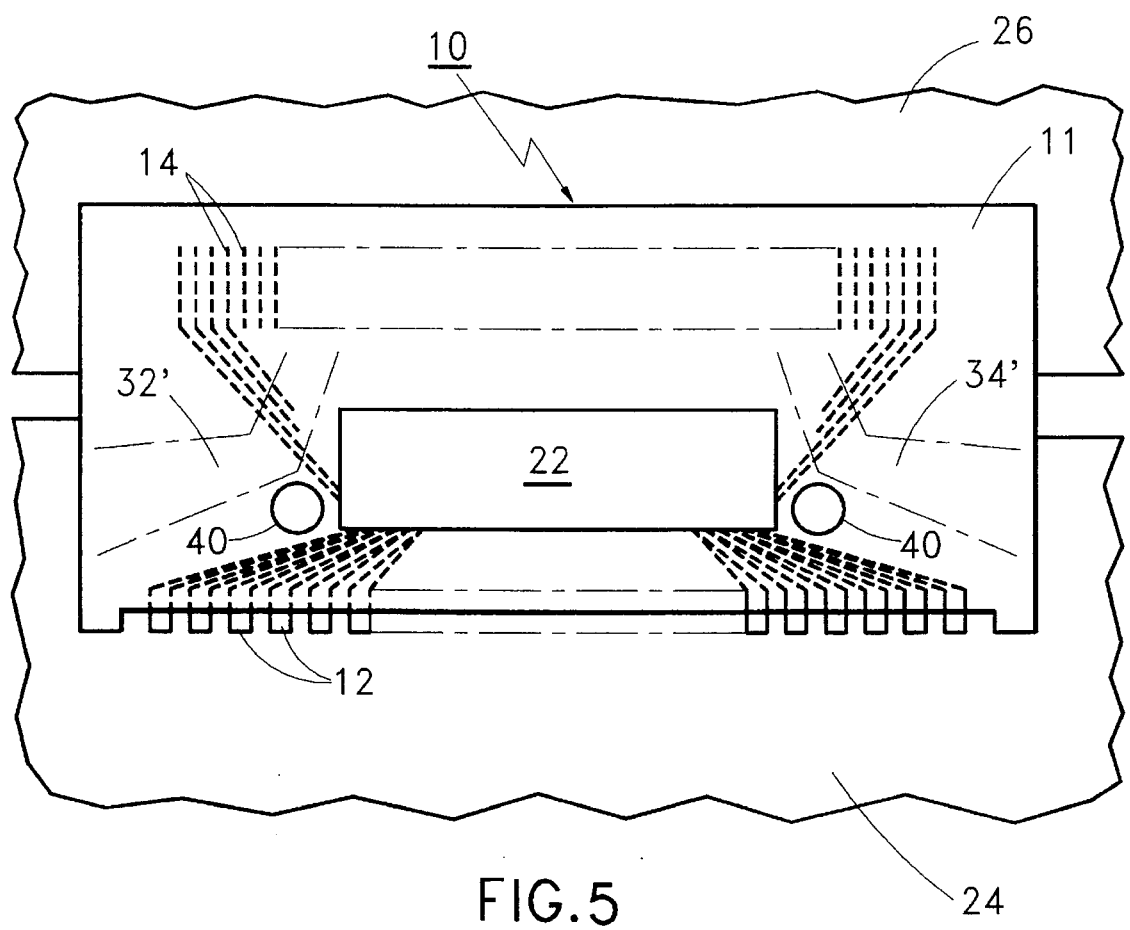
FIG. 5 shows the state in which an LCD driver package of this invention is mounted.
Figure 6:
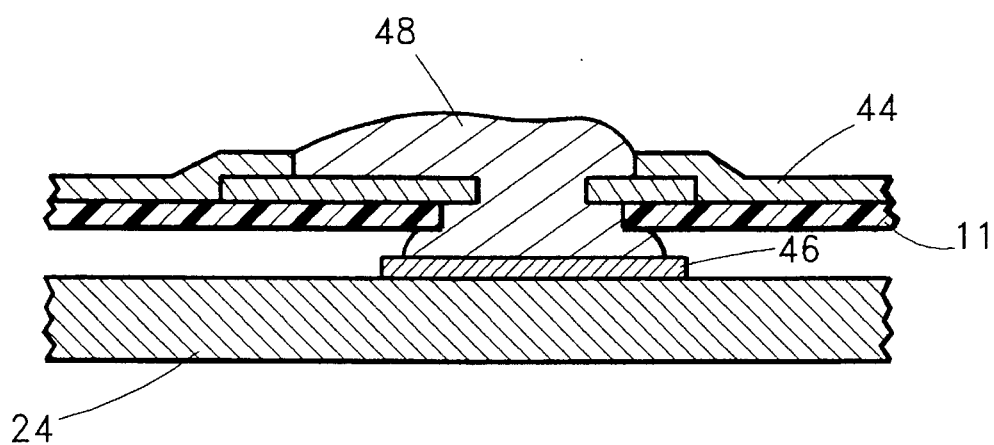
FIG. 6 is a cross-sectional view of a soldered anchor hole.

FIG. 5 shows the state in which an LCD driver package is mounted. FIG. 6 shows a cross-sectional structure of a soldered anchor hole. The printed circuit board 24 has a board pad 46 made of zinc-coated copper in a position corresponding to the anchor hole 40, and the tape carrier 10 is anchored to the printed circuit board 24 with solder 48 after mounting of the LCD driver package.

When the tape 10 is anchored to the printed circuit board 24 through the anchor hole 40, the twisting or wrinkling of the tape as explained with reference to FIG. 2 occurs in the direction of the tape edges where no input leads are formed (in the regions 32' and 34') and hence the twisting or wrinkling does not propagate to the input leads, so that the above-mentioned damage to leads can be prevented. As far as the twisting or wrinkling of the tape is diverted in their directions not to propagate to the input leads, there is no restriction on the position and number of the anchor holes. It is preferable to make at least one pair of anchor holes across the chip mounting opening 16.

In the preferred embodiment, the anchor holes have been fixed to the circuit board with solder but may be fixed with an adhesive. In this case, neither the anchor pad 42 on the tape nor the board pad 46 need to be provided. However, the use of soldering has the advantage of easy removal for replacement or repair of defective driver packages. Moreover, though in the embodiment the chip is mounted in the chip mounting opening 16, this invention can also be applied to a driver package tape carrier wherein the chip is mounted on the tape carrier by face-down bonding.

This invention enables prevention of damage to leads due to stress caused by the difference in thermal expansion coefficient between the printed circuit board and the glass board, vibration, or deflection or deformation of the printed circuit board. Accordingly, this invention facilitates using an even larger LCD glass board and an even larger circuit board and thus facilitates enlarging a display face of a liquid crystal display (LCD). The solution suggested by this invention is simple, economical and easy to implement. The use of solder in fixing the anchor holes facilitates the replacement of package.

We claim:

1. A liquid crystal display (LCD) comprising:

a glass board having liquid crystal panel electrodes;

a circuit board;

an LCD driver tape carrier package having a chip mounting Opening, input leads connecting said chip mounting Opening to said circuit board, output leads connecting said chip mounting opening to said liquid crystal panel electrodes, and an LCD driver chip mounted in said chip mounting opening and connected to said input leads and said output leads;

wherein said tape carrier has at least one pair of anchor holes arranged along opposite sides of and laterally spaced from said chip mounting opening in a region where neither said input leads nor said output leads are formed, said tape carrier being anchored to said circuit board via the anchor holes;

at least one of said anchor holes on each side of said chip mounting opening being spaced from said chip mounting opening by a distance of from 0.2to 10mm in order to prevent twisting and wrinkling of the tape carrier in the region of the output leads from propagating to the input leads.

2. A liquid crystal display (LCD) as set forth in claim 1, wherein said tape carrier has metal anchor pads in the positions of said anchor holes, said circuit board has metal board pads in the positions corresponding to said anchor holes, and said anchor pads are soldered on said board pads.

3. A liquid crystal display (LCD) as set forth in claim 1, wherein said tape carrier is anchored to said circuit board via said anchor holes with an adhesive.

4. A tape carrier for an LCD driver package having an insulating film tape with a chip mounting site, input leads provided on said tape to extend from said chip mounting site to one edge of said tape and adapted to be connected to a circuit board at said one edge, and output leads provided on said tape to extend from said chip mounting site to the other side of said tape and adapted to be connected to the electrodes on the glass board of a liquid crystal panel at said other edge, characterized in that:

said tape carrier includes at least one pair of anchor holes for anchoring said tape carrier to said circuit board, said anchor holes being provided along opposite sides of and laterally spaced from said chip mounting site in a region where neither said input leads nor said output leads are formed, at least one of said anchor holes on each side of said chip mounting site being spaced from said chip mounting site by a distance of from 0.2to 10mm in order to prevent twisting and wrinkling of the tape carrier in the region of the output leads from propagating to the input leads.

5. A tape carrier for an LCD driver package as set forth in claim 4, wherein said tape carrier has metal anchor pads in the positions of said anchor holes and is adapted to be soldered to said circuit board.

* * * * *